United States Patent [19]

Iguchi et al.

[11] Patent Number: 5,362,670
[45] Date of Patent: Nov. 8, 1994

[54] SEMICONDUCTOR DEVICE PRODUCING METHOD REQUIRING ONLY TWO MASKS FOR COMPLETION OF ELEMENT ISOLATION REGIONS AND P- AND N-WELLS

[75] Inventors: Katsuji Iguchi, Yamato-kooriyama; Shigeki Hayashida, Kita-katsuragi; Akio Kawamura, Nara; Shinichi Sato, Nara; Tomohiko Tateyama, Nara, all of Japan

[73] Assignee: Sharp Kabushiki Kaisha, Osaka, Japan

[21] Appl. No.: 103,250

[22] Filed: Aug. 9, 1993

[30] Foreign Application Priority Data

Aug. 10, 1992 [JP] Japan .................................. 4-212890
Feb. 10, 1993 [JP] Japan .................................. 5-022592

[51] Int. Cl.$^5$ ............................................. H01L 21/76
[52] U.S. Cl. ........................................ 437/70; 437/46; 437/56; 437/968; 148/DIG. 117
[58] Field of Search ................. 437/69, 70, 46, 56, 437/34, 968; 148/DIG. 117

[56] References Cited

U.S. PATENT DOCUMENTS

| | | | |
|---|---|---|---|
| 4,435,896 | 3/1984 | Parrillo et al. | 437/69 |
| 4,803,179 | 2/1989 | Neppl et al. | 148/DIG. 117 |
| 4,906,595 | 3/1990 | Van der Plas et al. | 437/69 |
| 5,141,882 | 8/1992 | Komori et al. | 437/34 |
| 5,166,087 | 11/1992 | Kakimoto et al. | 437/44 |
| 5,225,365 | 7/1993 | Cosentino | 437/69 |

FOREIGN PATENT DOCUMENTS

| | | | |
|---|---|---|---|
| 0138068 | 8/1983 | Japan | 437/34 |
| 2-54571 | 2/1990 | Japan . | |
| 0189965 | 7/1990 | Japan | 437/968 |
| 3-268355 | 11/1991 | Japan . | |

OTHER PUBLICATIONS

IEEE, 1991, pp. 637-640; Kanaba et al; "A 7 Mask CMOS Technology Utilitizing Liquid Phase Selective Oxide Deposition".
IEEE, 1980, pp. 752-755; Parrillo et al; "Twin-Tub CMOS—A Technology for VLSI Circuits".

*Primary Examiner*—Tom Thomas
*Assistant Examiner*—Trung Dang
*Attorney, Agent, or Firm*—Nixon & Vanderhye

[57] ABSTRACT

Element isolation regions are first formed on a silicon substrate. Active regions other than the isolation regions are formed with an oxide film. Then, a first oxidization prevention layer, a semiconductor layer and a second oxidization prevention layer are formed on the substrate in that order. A resist pattern having a hole in a P-channel MOS transistor formation region is formed. The second oxidization prevention layer in the P-channel MOS transistor formation region is removed and an impurity is ion-implanted using the resist pattern as a mask. After removing the resist pattern, the substrate is thermally treated in the presence of an oxidizer substance to transform an exposed portion of the semiconductor layer into an oxidized semiconductor layer and at the same time to diffuse the implanted impurity in the substrate to thereby form an N-well. After removing the remaining second oxidization prevention layer and the semiconductor layer located under the remaining second oxidization prevention layer, an impurity is ion-implanted into the substrate using the oxidized semiconductor layer as a mask, to thereby form a P-well in a N-channel MOS transistor formation region of the substrate. Then the P-channel and N-channel MOS transistors are formed in respective regions.

18 Claims, 7 Drawing Sheets

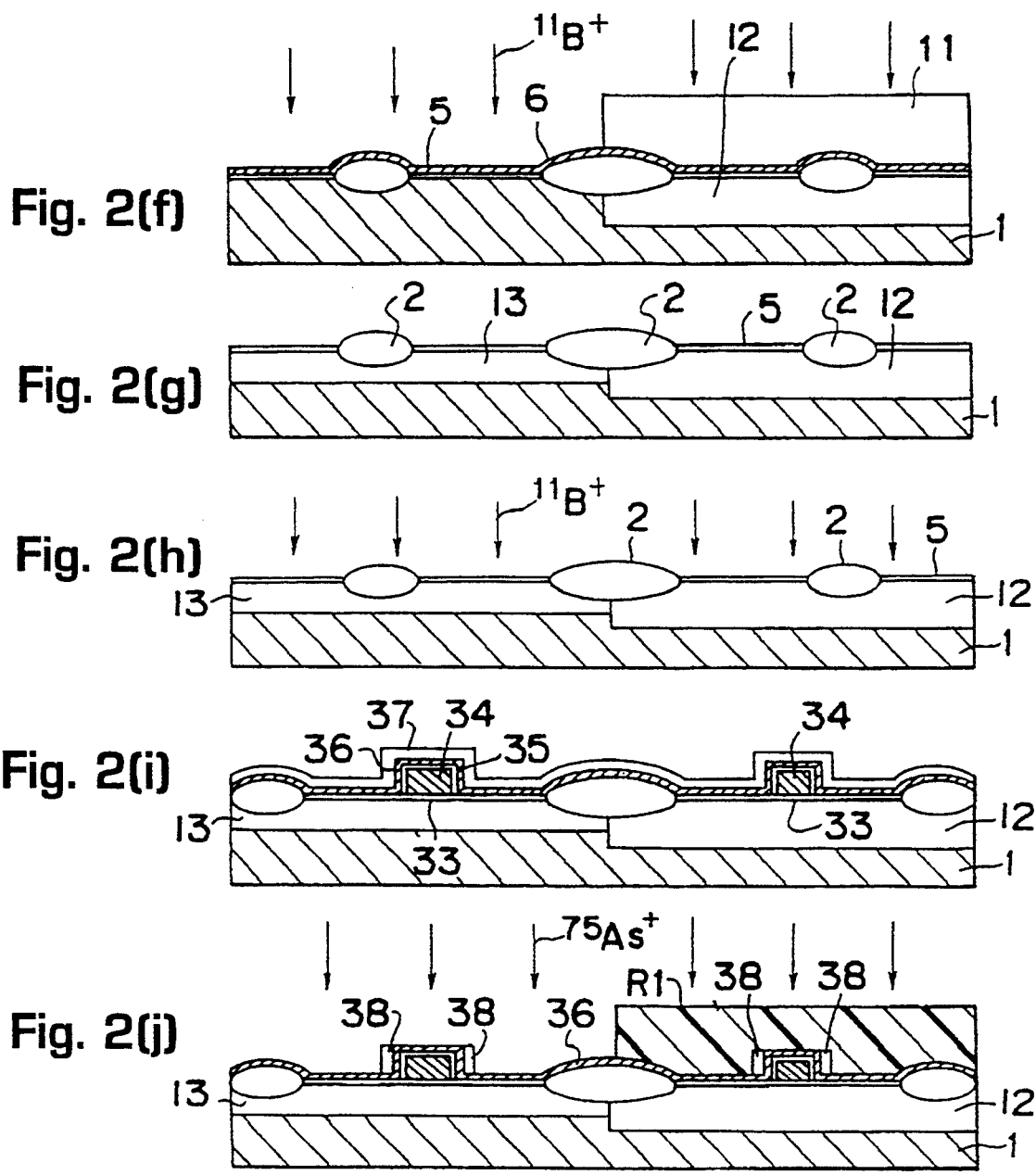

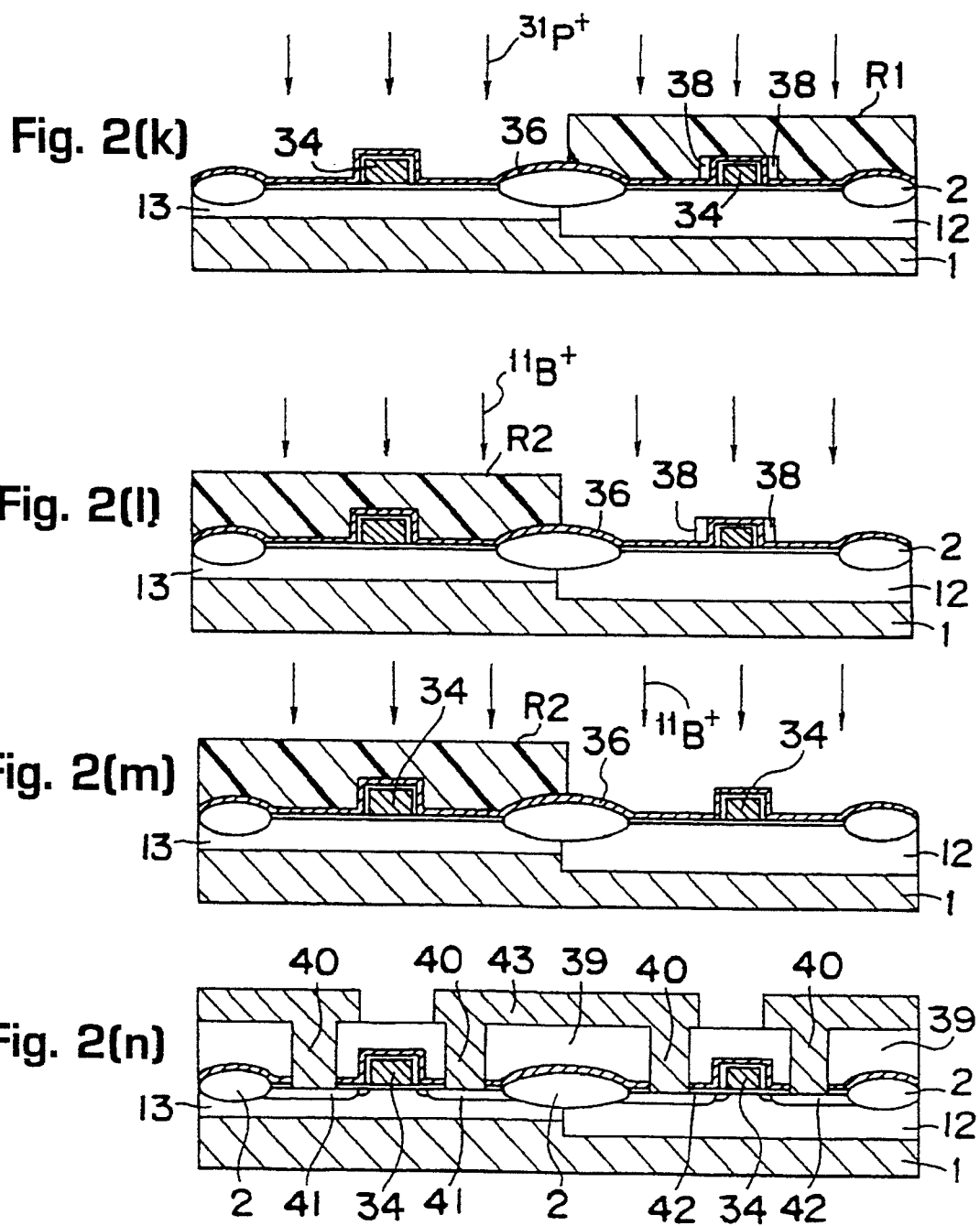

SEMICONDUCTOR DEVICE PRODUCING METHOD REQUIRING ONLY TWO MASKS FOR COMPLETION OF ELEMENT ISOLATION REGIONS AND P- AND N-WELLS

BACKGROUND OF THE INVENTION

1. Field of the Invention

The present invention relates to a semiconductor device producing method, and more particularly to a method of producing a CMOS (Complementary Metal Oxide Semiconductor) device.

2. Description of the Prior Art

Conventional CMOS device production involves the processes of well formation, element isolation region formation, N-channel transistor channel-stop implantation, N-channel transistor channel implantation, P-channel transistor channel implantation, gate electrode formation, LDD (Lightly Doped Drain) N− implantation, LDD P− implantation, source and drain N+ implantation, source and drain P+ implantation, contact hole formation, and metal wiring. Among those processes there are about twelve processes which require use of a mask.

FIGS. 1(a) to 1(f) show an example of such a conventional CMOS device production method, wherein step (d) in FIG. 1(a) is continued on step (e) in FIG. 1(e). The conventional method requires at least three masking or lithography processes before the gate electrode formation starts, as described below.

In more detail, a 60 nm thick silicon oxide film 52 and a 120 nm thick silicon nitride film 53 are formed on a surface of a silicon substrate 51 at step (a).

Then at step (b) a resist pattern 54 having an opening in an N-well formation region N is formed through photolithography, and the silicon nitride film 53 in the region N is removed. Subsequently, about $1.1 \times 10^{13}$ cm$^{-2}$ of phosphorus ions are implanted using the resist pattern 54 as a mask.

Then at step (c) the resist pattern 54 is removed and the substrate is subjected to an oxidization process to form a 390 nm thick oxide film 55 in the region N. At this time, an N-well 56 is formed in the substrate 51. After removing the remaining silicon nitride film 53, about $1.2 \times 10^{13}$ cm$^{-2}$ of boron ions are implanted. The ion implantation energy is so set that the ions do not pass through the oxide film 55, whereby the boron ions are implanted only in a silicon substrate region P which is not covered with the oxide film 55.

Then at step (d) the substrate is thermally treated to form a P-well 57 having a depth of 1.5 μm.

According to this conventional method, the P-well 57 is formed without requiring a resist pattern formation step and using the oxide film as a mask, that is, the P-well is self-aligned. However, disadvantageously a difference in level of 0.17 μm takes place at the boundary between the N-well and the P-well.

Then at step (e) an oxide film 58 and a silicon nitride film 59 are formed on the entire surface of the silicon substrate 51. Subsequently, using a second resist pattern (not shown) having an opening for each element isolation region 60, the silicon nitride film 59 in each element isolation region 60 is removed. In order to increase the concentration of boron in the P-well 57 underneath each element isolation region 60, a third resist pattern 61 is formed which has an opening in each element isolation region 60 of the P-well 57, and about $3 \times 10^{12}$ cm$^{-2}$ of boron ions are implanted from above the resist pattern 61.

The reason for the implantation of boron ions in the P-well is as follows. Boron ions constituting the P-well tend to be segregated from the P-well into an oxide film during the formation of the oxide film through heat-treatment. Therefore, when the element isolation regions are formed by a LOCOS method involving a heat-treatment after completion of the wells as in the conventional method described herein, boron ions in the P-well are segregated into the oxide layer of each element isolation region and the boron concentration decreases at a portion below the LOCOS oxide layer. This in turn causes a field inversion because positive electric charges exist at the interface between the oxide layer and silicon. In order to prevent this from occurring, in the conventional method, boron ions are preliminarily implanted in portions corresponding to the element isolation regions in only the P-well to compensate the decrease in the boron concentration during the heat treatment of the substrate.

For the above reason, an extra dosage of impurity was implanted only in the element isolation regions in the P-well. It is noted that the ion implantation energy is set to such a level that the boron ions do not pass through the silicon nitride film 59 in order to prevent the boron from entering into the active regions.

At step (f), after removing the resist pattern 61, the whole substrate is subjected to an oxidization process to form an oxide film 62 having a thickness of 0.4 μm as isolator. At this time, a heavily boron-doped region 63 being a channel-stop layer is formed under each element isolation region in the P-well. Subsequently, the oxide film 5 is removed and an oxide film 64 is newly formed on the top surface of the substrate, and about $3 \times 10^{12}$ cm$^{-2}$ of boron ions are implanted for controlling the threshold voltage of transistors to be formed.

In the process of forming source and drain diffusion layers after the gate electrode formation, all the ion implantation processes are completed in at least two masking or lithography processes.

There is also proposed a seven mask CMOS process using a special oxide deposition method (K. Kanba et al., "A 7 Mask CMOS Technology Utilizing Liquid Phase Selective Oxide Deposition" EDM 91, treatise No. 25.1.)

As described above, the conventional method has an advantage that self-alignment can be used for the formation of the P-well. However, since the formation process of the element isolation regions involving a heat-treatment of the substrate follows completion of the wells, an additional ion-implantation process is required for formation of a channel-stop layer for the above-described reason. This additional ion-implantation requires an additional masking or lithography process.

The number of steps required for producing an LSI is approximately proportional to the number of masking processes. Increase in number of processes leads to the reduction of yield, which in turn results in increase of prices more than the natural increase of production costs due to the mere increase in number of processes.

If it is attempted to produce the channel-stop layer without using the masking process for defining the channel-stop region, each element isolation region in the P-well is required to have a significantly great width. Furthermore, since a difference in level takes place between the N-well region and the P-well region, a focus margin in an optical exposure process for pattern formation is reduced, which disadvantageously causes a constriction to take place in a pattern which intersects a stepped portion formed between the wells due to the difference in level. Furthermore, since the impurities are distributed in the substrate through diffusion in both the wells, it is impossible to achieve an accurate control of the distribution profile of impurities in the channel section of each transistor. Accordingly, it is impossible to take appropriate measures against the short channel effect of the transistor.

SUMMARY OF THE INVENTION

The present invention has been developed with a view to substantially solving the above described disadvantages and has for its essential object to provide an improved semiconductor device producing method which can produce a high-accuracy semiconductor device in a short production time through a simple production process with a reduced number of masking processes while securing a high yield.

In order to accomplish the above object, a semiconductor device producing method of the present invention comprises the steps of:

a) forming element isolation regions of an oxide on a surface of a semiconductor substrate, active regions of the surface of said semiconductor substrate other than said element isolation regions being formed with an oxide film;

b) forming a first oxidization prevention layer, a semiconductor layer, and a second oxidization prevention layer in that order on said semiconductor substrate formed with said element isolation regions and oxide film;

c) forming a resist pattern on said second oxidization prevention layer, said resist pattern having a hole in a first conductive type channel MOS transistor formation region wherein a first conductive type channel MOS transistor is to be formed;

d) removing a portion of said second oxidization prevention layer that exists in said first conductive type channel MOS transistor formation region of said semiconductor substrate, whereby a portion of said semiconductor layer that exists in said first conductive type channel MOS transistor formation region is exposed;

e) implanting a second conductive type impurity into said semiconductor substrate in said first conductive type channel MOS transistor formation region using said resist pattern as a mask;

f) removing said resist pattern;

g) thermally treating said substrate in the presence of an oxidizer substance to transform at least an upper portion of said exposed portion of said semiconductor layer into an oxidized semiconductor layer and at the same time to diffuse the implanted impurity in the substrate to thereby form a second conductive type well;

h) removing the remaining second oxidization prevention layer and said semiconductor layer located under the remaining second oxidization prevention layer, said remaining second oxidization prevention layer and semiconductor layer being located in a second conductive type channel MOS transistor formation region wherein a second conductive type channel MOS transistor is to be formed;

i) implanting a first conductive type impurity into said second conductive type channel MOS transistor formation region of the semiconductor substrate, using said oxidized semiconductor layer as a mask, to thereby form a first conductive type well; and j) forming the first and second conductive type channel MOS transistors in said second and first conductive type wells, respectively.

The semiconductor substrate may be, for example, a P-type silicon substrate or an N-type silicon substrate having a resistivity of 12 to 15 Ωcm. Since the P- or N-well formed in the semiconductor substrate tends to be a shallow well, it is preferable to preliminarily form a buried layer having a depth of 1 to 2 $\mu$m and a peak density of $1 \times 10^{17}$ cm$^{-3}$ to $1 \times 10^{18}$ cm$^{-3}$ for compensation for the shallowness of the wells. When the shallow well is of a P-type, the buried layer can be formed by diffusing a dopant such as boron from the entire surface of the substrate. When the shallow well is of an N-type, the buried layer can be formed by diffusing a dopant such as phosphorus in the same manner as above.

The formation of the element isolation regions of oxide can be effected, for example, by the LOCOS method, poly-pad LOCOS method, or OSELO method. The thickness of the element isolation regions is normally 200 to 500 nm. The oxide film formed on the active regions other than the element isolation regions can be formed by a known method such as the thermal oxidization method or the CVD method. The oxide film normally has a film thickness of 10 to 50 nm.

The purpose of the first oxidization prevention layer formed on the semiconductor substrate having the element isolation regions and the oxide film is to prevent the semiconductor substrate from being oxidized during a later oxidization process of the semiconductor layer, etc. The first oxidization prevention layer can be made of silicon nitride, tantalum pentoxide (Ta$_2$O$_5$), etc. The first oxidization prevention layer can be formed by a known method such as the CVD method. The layer preferably has a film thickness of 10 to 60 nm.

A semiconductor film may be formed before forming the first oxidization prevention layer on the semiconductor substrate. This semiconductor film under the first oxidization prevention layer is preferred for the reason that it can ease stress generated when the aforementioned semiconductor layer formed on the first oxidization prevention layer is thermally oxidized. It is preferred that the semiconductor film formed before the first oxidization prevention layer is made of either polycrystalline or amorphous silicon and has a film thickness of 10 to 80 nm.

The purpose of the semiconductor layer formed on the first oxidization prevention layer is to form an oxide layer in the first conductive type MOS transistor formation region through transformation of the semiconductor layer in the thermal oxidization process. The semiconductor layer is preferably made of polycrystalline or amorphous silicon. The layer is normally 200 to 400 nm thick.

An oxide film may be formed before forming the semiconductor layer. The oxide film preferably has a film thickness of 5 to 30 nm.

The purpose of the second oxidization prevention layer is to prevent the semiconductor layer in the second conductive type MOS transistor formation region from being oxidized in the thermal oxidization process. This layer can be made of silicon nitride layer, tantalum pentoxide (Ta$_2$O$_5$), similarly to the first oxidization prevention layer. The second oxidization prevention layer can be formed by a known method such as the CVD method. The layer preferably has a thickness of 50 to 250 nm.

The purpose of the resist pattern is, on one hand, to pattern the second oxidization prevention layer and on the other hand to mask the second conductive type MOS transistor formation region when an impurity for the second conductive type well is implanted into the semiconductor substrate in the first conductive type MOS transistor formation region. The thickness of the resist pattern is preferably 0.7 to 4.0 μm, from the point of view that the resist pattern should not allow the impurity to pass therethrough. Hole edges of the resist pattern exist above corresponding element isolation regions.

A portion of the second oxidization prevention layer that exists in the first conductive type channel MOS transistor formation region is etched away in accordance with a pattern of the resist pattern. Subsequently, using the resist pattern as a mask, a second conductive type impurity is implanted into the semiconductor substrate through at least the three layers of the semiconductor layer exposed through etching, the first oxidization prevention layer, and the oxide film or the element isolation region.

The second oxidization prevention layer can be etched by a dry etching method using a fluorocarbon-based gas. The semiconductor layer located under the second oxidization prevention layer should be exposed without being etched or with being etched as little as possible.

The implantation of the aforementioned second conductive type impurity is performed to form the second conductive type well in the first conductive type channel MOS transistor formation region in the semiconductor substrate. In order to prevent the impurity from being implanted in regions other than the first conductive type channel MOS transistor formation region, the implantation is performed by controlling the implantation energy so that the impurity does not pass through the resist pattern but it passes through the semiconductor layer. The implantation energy is normally 100 to 5000 keV. The impurity dose is normally $1 \times 10^{12}$ to $1 \times 10^{14}$ cm$^{-2}$. When the second conductive type well is an N-well, an impurity such as phosphorus, arsenic, for example, is used. When the second conductive type well is a P-well, an impurity such as boron, indium, etc. is used.

Then by heating the semiconductor substrate in the presence of an oxidizer substance after removing the resist pattern, the semiconductor layer is transformed into an oxidized semiconductor layer and the implanted impurity is diffused to form a second conductive type well in the first conductive type channel MOS transistor formation region.

Steam, oxygen, or the like is used as the oxidizer substance.

The purpose of the above heating of the substrate is on one hand to form the oxidized semiconductor layer and on the other hand to diffuse the impurity, and for that purpose the heating is effected at a temperature of 950° to 1200° C. for 150 to 300 minutes under the atmospheric pressure.

The oxidized semiconductor layer is intended to mask the first conductive type channel MOS transistor formation region when the first conductive type impurity is implanted in the second conductive type channel MOS transistor formation region in the semiconductor substrate, so that the layer has a film thickness serving that purpose. The film thickness is normally 0.4 to 1.0 μm. When the film thickness is smaller than 0.3 μm, the first conductive type impurity is, disadvantageously, also implanted into the first conductive type channel MOS transistor formation region as well. The oxidized semiconductor layer may be obtained through oxidization of only an upper portion of the exposed semiconductor layer, or through oxidization of the whole of the exposed semiconductor layer. Oxidization of only the upper portion is preferred because it allows the time required for the oxidization to be reduced, allows the distance of diffusion of the impurity implanted in the semiconductor substrate to be reduced, and allows the impurity distribution profile to be accurately controlled.

In the present invention, after removing the remaining second oxidization prevention layer and the semiconductor layer thereunder, the first conductive type impurity is implanted into the second conductive type channel MOS transistor formation region in the semiconductor substrate using the oxidized semiconductor layer as a mask to form the first conductive type well. Namely, according to the present invention, the second conductive type well is formed by self-alignment due to the presence of the oxidized semiconductor layer.

The second oxidization prevention layer is removed selectively so that the above-mentioned oxidized semiconductor layer is not etched. When a silicon nitride film is used as the second oxidization prevention layer, the layer can be removed, for example, by using a heated concentrated phosphoric acid, or the like.

The semiconductor layer can be removed selectively through plasma etching, for example.

The purpose of the implantation of the first conductive type impurity is to form the first conductive type well in the second conductive type channel MOS transistor formation region in the semiconductor substrate. Therefore, the implantation is performed by controlling energy so that the impurity does not enter the semiconductor substrate in the first conductive type channel MOS transistor formation region but enters the semiconductor substrate in the second conductive type channel MOS transistor formation region, even its portions underneath the thick element isolation regions formed of an oxide. The implantation is preferably performed plural times by changing the implantation energy. The implantation energy is normally 10 to 1000 keV. The dosage of impurity is normally $1 \times 10^{12}$ to $1 \times 10^{14}$ cm$^{-2}$.

Subsequently, the oxidized semiconductor layer in the first conductive type channel MOS transistor formation region is removed by means of, for example, a hydrofluoric acid aqueous solution. Then, the semiconductor portion, if leaved unoxidized, is removed by plasma etching. Thereafter, the first oxidization prevention layer over the substrate is removed by means of, for example, heated concentrated phosphoric acid solution. After rinsing, the first conductive type impurity is diffused through heat treatment to form the first conductive type well. This heat treatment can be omitted, Next, further ion implantation of the first conductive type impurity is performed to control a threshold voltage of the transistor. The threshold voltage is controlled by this implant and the implant of the first conductive type well. When a P-channel MOS transistor is formed as the first conductive type MOS transistor in a surface-channel style, the ion implantation is not always required.

Thus the well formation and element isolation region formation are completed. Subsequently, the first and second conductive type channel MOS transistors are fabricated respectively in and on the second and first conductive type wells.

As described above, according to the method of the present invention, the formation of the element isolation regions which requires heat-treatment of the substrate precedes the formation of the wells. Therefore, the decrease in concentration of the impurity present below the element isolation regions is greatly suppressed and an almost uniform impurity concentration is obtained in every portion of the wells. Accordingly, the ion-implantation step for forming the channel stop layers is not necessary and therefore the masking process therefor is not necessary, either. That is, according to the present invention, the number of masking or lithography processes is reduced by one from that of the conventional method shown in FIGS. 1(a) to 1(f).

Furthermore, according to the present invention, no difference in level occurs between the wells. In addition, at least one conductive type transistor is not subjected to a long-time high-temperature heat treatment after the implantation of the impurity into the channel section, and therefore a high-accuracy distribution control can be achieved to suppress the short channel effect more effectively.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes a semiconductor device producing method in accordance with the present invention with reference to the attached drawings.

First Embodiment

Figure 1A:
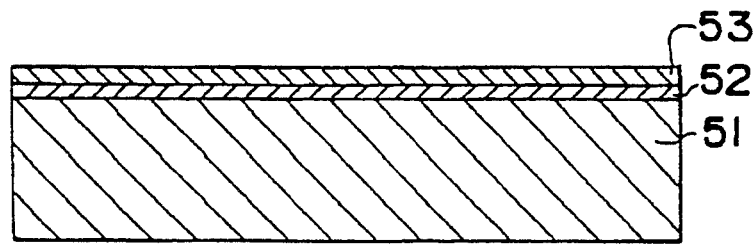
FIGS. 1(a)–1(f) illustrate the conventional semiconductor device production process, wherein step (d) in FIG. 1(d) is continued on step (e) in FIG. 1(e)
Figure 1B:
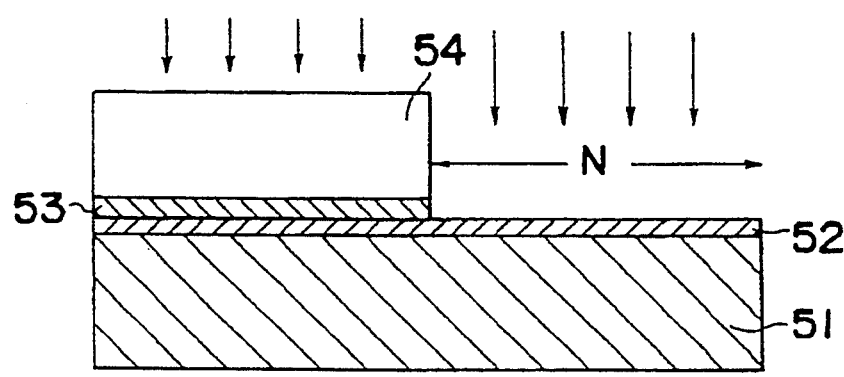
Figure 1C:
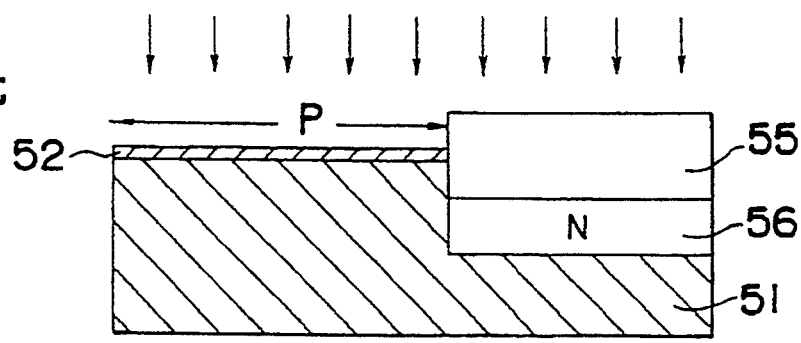
Figure 1D:
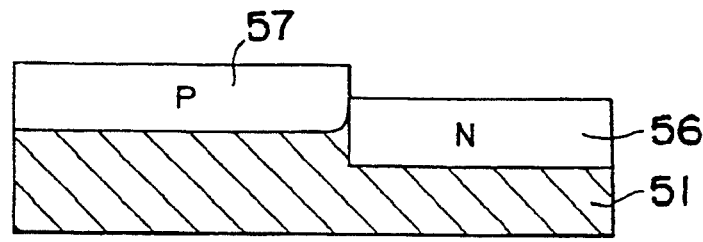
Figure 1E:
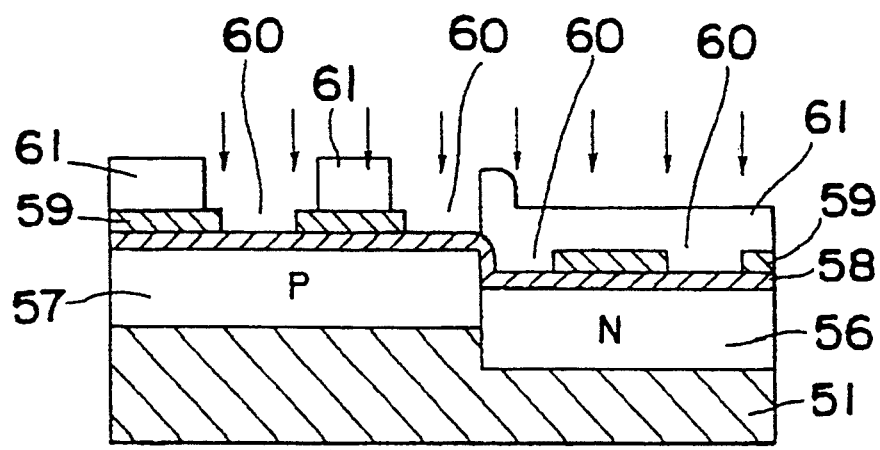
Figure 1F:
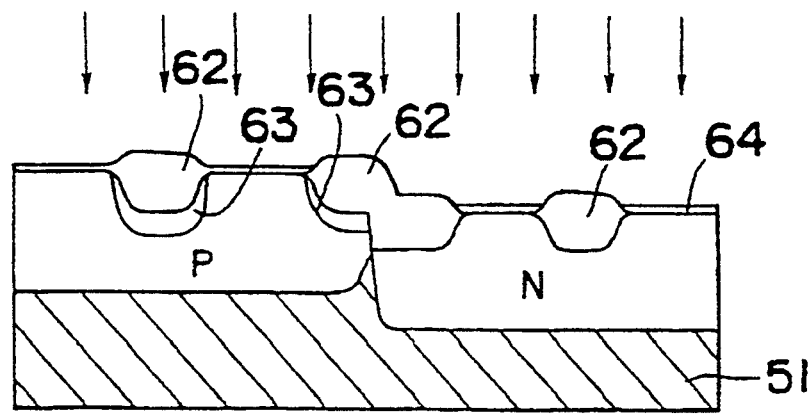
Figure 2A:
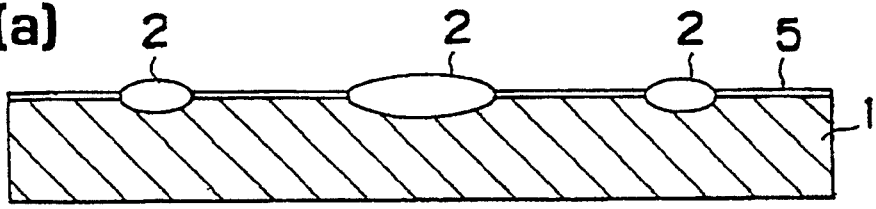
FIGS. 2(a)–2(n) illustrate a semiconductor device production process according to a first embodiment of the present invention, wherein step (e) in FIG. 2(e) is continued on step (f) in FIG. 2(f), and step (j) in FIG. 2(j) is continued on step (k) in FIG. 2(k)
Figure 2B:
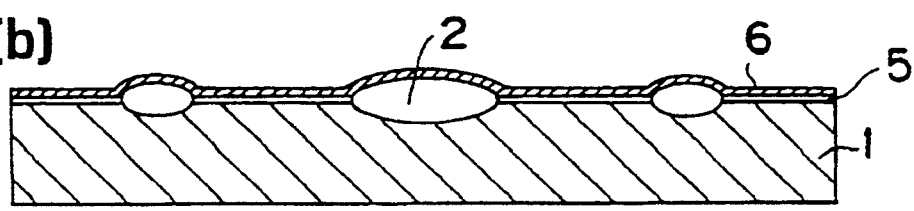
Figure 2C:
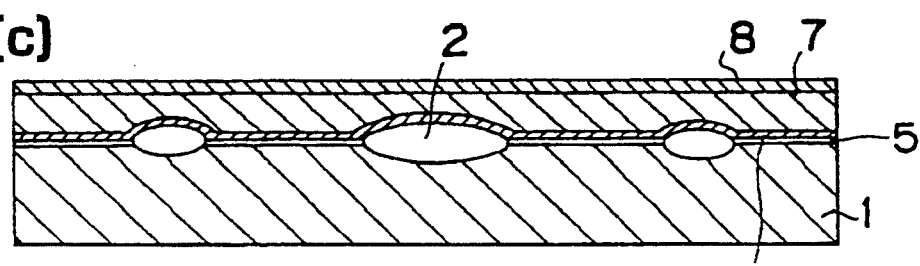
Figure 2D:
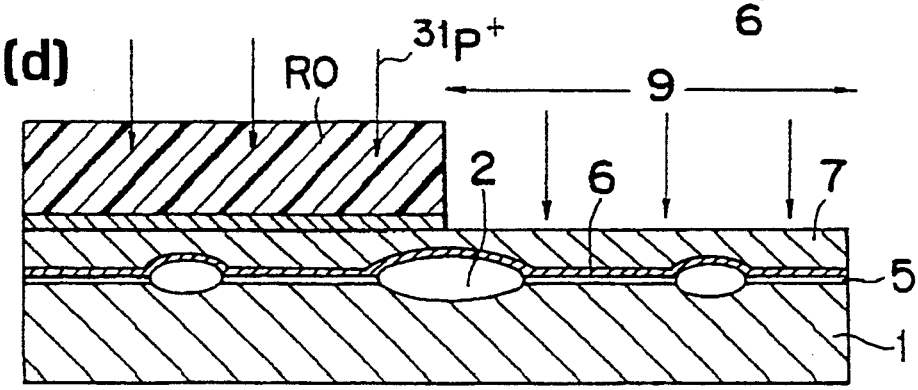
Figure 2E:
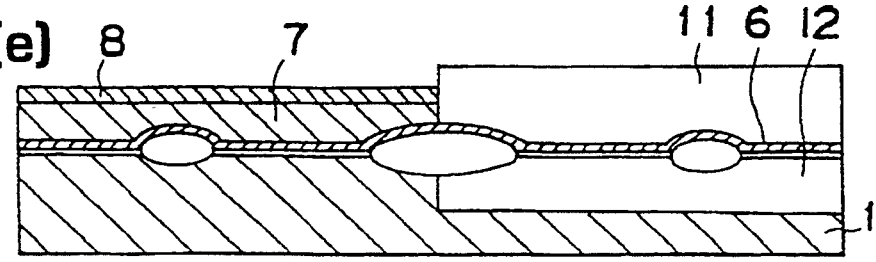

The following describes a semiconductor device producing method of a first embodiment with reference to FIGS. 2(a) through 2(n).

At step (a), element isolation regions 2 each having a thickness of 350 nm are formed on a P-type silicon substrate 1 having a resistivity of 12 to 15 $\Omega$cm by a poly-pad LOCOS (LOCal Oxidation of Silicon) method. A lithography process is carried out for the formation of the element isolation regions 2. Active regions are coated with an oxide film 5 having a thickness of 20 nm. It is noted that a boron diffusion layer has been preliminarily formed on the entire surface of the silicon substrate 1. This arrangement is adopted for the reason that a P-well to be formed later (step (g)) is relatively shallow, and intended, for the purpose to compensate the shallowness of the well, to form a deep buried layer having a depth of 1 to 2 $\mu$m and a peak density of $1 \times 10^{17}$cm$^{-2}$ to $1 \times 18^{18}$cm$^{-2}$.

Then, at step (b), a thin silicon nitride film 6 having a thickness of 50 nm is formed as a first oxidization prevention layer on the entire surface of the silicon substrate.

At step (c), polysilicon film 7 having a thickness of 350 nm is further deposited. Subsequently, a silicon nitride film 8 having a thickness of 120 nm is deposited as a second oxidization prevention layer.

Then, at step (d), a resist pattern R0 is formed. The resist pattern R0 has an opening in a region 9 where an N-well is to be formed. Then the silicon nitride film 8 is removed through etching using the resist pattern R0 as a mask. It is preferred that the polysilicon film 7 not be etched when the silicon nitride film 8 is etched, if possible. Then, for the formation of an N-well, phosphorus ions are implanted in a condition of 850 keV and $1 \times 10^{13}$ cm$^{-2}$. The ion implantation energy is set so high that the ions reach the silicon substrate 1 through the polysilicon film 7. At the same time, the resist R0 is required to have a sufficient thickness so that the ions do not enter into any regions other than the N-well regions 9.

At step (e), after removing the resist pattern R0, the polysilicon film 7 in the N-well region 9 is oxidized at a temperature of about 1050° C. for 290 minutes in an environment of steam, and an SiO$_2$ film 11 is formed. The regions other than the regions 9 are not oxidized by virtue of the silicon nitride film 8. At the same time, an N-well 12 is formed inside the silicon substrate 1 in the region 9 by the above-mentioned heat treatment. Although the pyrooxidization is used in the present example, the dry-oxidization may be used instead with no problem. The formed oxide film is required to have a sufficient thickness to prevent boron ions from entering into the N-well 12. Practically, the oxide film was formed to have a thickness of about 700 nm. Then the remaining silicon nitride film 8 is removed by a heated concentrated phosphoric acid. However, the SiO$_2$ film 11 is scarcely etched.

Then, at step (f), the polysilicon film 7 is selectively removed through plasma etching. In the above case, the oxide film 11, the silicon nitride film 6, and the oxide film 5 in the region 9 are scarcely etched to remain. Then boron ions are implanted into the silicon substrate 1 in P-well regions (other than the regions 9) using the oxide film 11 as a mask. It is preferred that the implantation of boron ions is repeated plural times with the ion implantation energy varied. In the present example, ion implantation was performed two times in a condition of 150 keV and $5 \times 10^{12}$ cm$^{-2}$ and in a condition of 80 keV and $4 \times 10^{12}$ cm$^{-2}$. The ion implantation energy must be set at a level enabling the ions to reach a lower portion of the element isolation region 2. At the same time, the thickness of the oxide film 11 must be selected such that the boron ions do not reach the silicon substrate 1 through the oxide film 11.

At step (g), the oxide film 11 is removed with a hydrofluoric acid aqueous solution. After that, the silicon nitride film 6 is removed through a treatment by heated concentrated phosphoric acid. After cleansing, the substrate is heat-treated at a temperature of 1100° C. for about 120 minutes in an environment of nitrogen. Though this heat treatment, the boron ions diffuse to thereby form a P-well 13 which has an almost constant boron concentration in every portion including a portion underneath the element isolation region. It is noted that the heat treatment can be omitted.

Subsequently, at step (h), in order to control the threshold voltage of a transistor to be formed, boron ions are implanted in a condition of 15 keV and $2 \times 10^{12}$cm$^{-2}$. In the present embodiment, a P-channel transistor to be formed is of a buried-channel type. Therefore, in order to control the threshold voltage of the P-channel transistor, a boron-ion channel is indispensable where N+polysilicon is used for a gate electrode. The threshold voltage of an N-channel transistor to be formed is controlled by the boron ion implantation at the present step (h) and the boron ion implantation performed at the previous step (f). When a P-channel transistor of a surface-channel style is adopted instead of the buried-channel type P-channel transistor, the present ion implantation is not always necessary.

Thus the formation of wells and element isolation regions is completed with only two mask processes. Afterward, transistors are formed in the following manner.

At step (i), the oxide film 5 is removed and a gate oxide film 33 and a gate electrode 34 are formed by a known technique, and therefore no description therefor is provided herein. After the formation of the gate electrode 34, an oxide film 35 having a thickness of 20 nm (in a range of 10 to 50 nm), a silicon nitride film 36 having a thickness of 20 nm (in a range of 10 to 50 nm), and an oxide film 37 having a thickness of 100 nm (in a range of 50 to 300 nm) are formed in sequence.

Then, at step (j), the oxide film 37 is etched through a reactive ion etching method to form a side wall 38 on each side of the gate electrode 34. Subsequently, a resist pattern R1 having an opening in an N-channel transistor formation region is formed, and arsenic ions ($^{75}$As+) are implanted in a condition of 50 keV and $3 \times 10^{15}$ cm$^{-2}$. Thus a heavily doped N-type diffusion layer constituting the source and drain of the N-channel transistor is formed.

Removal of the oxide film 37 may be effected by performing a reactive ion etching process first and then a wet etching process with an oxide film corroding solution such as a hydrofluoric acid aqueous solution.

Then, at step (k), the oxide film side walls 38 are etched using the resist pattern R1 as a mask, and phosphorus ions ($^{31}$P+) are implanted in a condition of 40 keV and $3 \times 10^{13}$ cm$^{-2}$. In this process, a lightly doped N-type diffusion layer constituting the source and drain of the N-channel transistor is formed to form what is called an LDD structure. The phosphorus ions may be implanted in a direction inclined at an angle of 7° with respect to the normal line of the wafer surface in accordance with a conventional manner, or in a direction inclined at a great angle of 45° or 60°. Arsenic ions having a diffusion speed lower than that of phosphorus ions may be implanted instead of the arsenic ions.

In the above process, boron ions ($^{11}$B+) may be further implanted in a direction inclined at a great angle of 30°, 45°, or 60° with respect to the normal line of the wafer surface. This ion implantation is what we call a halo implantation which is effective for suppressing the short channel effect of the transistor. In the present example, this halo implantation was performed in a condition of 30° of inclination, 55 keV, and $7 \times 10^{12}$ cm$^{-2}$.

Then, at step (l), a resist pattern R2 having an opening in a P-channel transistor formation region is formed, and boron ions are implanted. Silicon ions may be implanted prior to the ion implantation of Boron in order to transform the surface of the silicon substrate 1 into an amorphous state. It is also permissible to implant ions of boron difluoride ($^{49}$BF$_2$+). A heavily doped P-type diffusion layer constituting the source and drain of the P-channel transistor is thus formed. In the present example, the silicon ion implantation condition is 30 keV and $1 \times 10^{15}$ cm$^{-2}$, while the BF$_2$ ion implantation condition is 40 keV and $2 \times 10^{15}$ cm$^{-2}$.

Then, at step (m), the oxide film side walls 38 are removed through etching using the resist pattern R2 as a mask, and then boron ions ($^{11}$B+) are implanted. In the present embodiment, the ions are implanted in a condition of 15 keV and $3 \times 10^{13}$ cm$^{-2}$. As a result, a lightly doped P-type diffusion layer constituting the source and drain of the P-channel transistor is formed and the LDD structure is obtained. Boron ions may be implanted in a direction inclined at an angle of 7° with respect to the normal line of the wafer surface as usually done, or in a direction inclined at a large angle of 45° or 60°. It is noted that deterioration due to hot carrier effects is less in the P-channel transistor than in the N-channel transistor, and therefore it is not always necessary to form the P-channel transistor in the LDD structure and the step of the boron ion implantation here may be omitted.

In the above step (m), phosphorus ions ($^{31}$P+) or arsenic ions ($^{75}$As+) may be implanted in a direction inclined at a great angle of 30°, 45°, or 60° with respect to the normal line of the wafer surface. The implantation is what we call a halo implantation which is effective for suppressing the short channel effect of the transistor.

At step (n), after removing the resist R2, an oxide film 39 is deposited on the entire surface of the substrate or wafer. After heat-treatment of the wafer for the purpose of activating the wafer, contact holes 40 are formed above the N-type diffusion layer 41 and the P-type diffusion layer 42 to form metal wiring 43 made of an aluminum alloy or the like. Thus the fundamental CMOS-LSI production process is completed.

As obvious from the above description, by the production method of the first embodiment, the CMOS LSI is completed with only seven masks: a first one for the isolation region formation, a second one for the N-well formation, a third one for the gate-electrode formation, a fourth one for the N-type diffusion layer formation, a fifth one for the P-type diffusion layer formation, a sixth one for the contact hole formation and a seventh one for metal wiring.

The transistor formation process after the formation of the N-well and P-well is not limited to the process as described above, and the transistors may be produced in the following manner as well.

In one modification, for example, after a photo-processing stage for forming a resist pattern, impurities are lightly doped to form the N-channel LDD structure. And then, by way of another photo-processing stage, impurities are lightly doped to form the P-channel LDD structure. Subsequently, an oxide film side wall is formed in the same manner as in the first embodiment.

Thereafter, by way of a photo-processing stage, impurities are heavily doped to form an N+ region. By way of a photo-processing stage again, heavy doping of impurities is performed to form a P+ region.

In another modification, after the formation of the gate electrode, a lower silicon oxide film, an etching stopper film such as polysilicon or silicon nitride film, and an upper silicon oxide film are formed in that order. Subsequently, the P-MOS region is covered with a resist, and impurities are doped into the N-MOS region through the aforementioned laminate film to form an N+ region. Then an upper silicon oxide film of the N-MOS region is etched and impurities are doped into the P-MOS region while the NMOS region being covered with a resist, to form a P+ region. Subsequently, an annealing process is effected to recover the damage of the N+ region and the P+ region. Then impurities may be doped or ion-implanted approximately vertically or obliquely to form an N− region. At this time, the upper silicon oxide film in the P-MOS region serves as a mask, and therefore the photolithography process for the N− region formation can be omitted. Then the upper silicon oxide film of the P-MOS region is removed, and P− dopant is implanted into the P-MOS region while the N-MOS region being covered with a resist, to form a P− region. Subsequently, an annealing process is effected to suppress the diffusion of the impurities in the N− region and the P− region, whereby transistor characteristics against a short channel can be improved.

Second Embodiment

The following describes a semiconductor device producing method according to a second embodiment of the invention with reference to FIGS. 3(a)–3(f).

At step (a), element isolation regions 2 and an oxide film 5 are formed on a silicon substrate 1 in the same manner as in the first embodiment.

Then, at step (b), a 15 nm thick silicon nitride film 6 which serves as a first oxidization prevention layer and a 15 nm thick silicon oxide film 16 are formed on the entire silicon substrate.

At step (c), a polysilicon film 7 having a film thickness of 350 nm (3500 Å) angstrom and a silicon nitride film 8 which serves as a second oxidization prevention layer are further deposited in the same manner as in the first embodiment.

Then, at step (d), a resist pattern R0 open in an N-well region is formed and the silicon nitride film 8 is removed through etching using the resist pattern R0 as a mask. Then, for the formation of an N-well, phosphorus ions are implanted in similar conditions to those in the first embodiment.

Then, at step (e), after removing the resist pattern R0, a silicon oxide film 11 having a film thickness of about 700 nm is formed in the same manner as in the first embodiment. Then the remaining silicon nitride film 8 is removed by heated concentrated phosphoric acid.

Then, at step (f), the polysilicon film 7 is selectively removed through plasma etching. When the etching is performed by a magnetron type reactive ion etching apparatus using a chlorine gas, the selection ratio of the polysilicon film 7 to the oxide film 16 is about 30. Therefore, when a 30% over-etching is performed in the present example where the polysilicon film 7 has a thickness of 3500 Å, the silicon oxide film 16 is etched by 3500×0.3÷30=35 Å. However, the silicon oxide film 16 has a sufficient thickness of 15 nm, the progress of etching can be stopped at the silicon oxide film 16.

Then boron ions are implanted into the P-well formation regions (other than the regions 9) in the silicon substrate 1 in the same manner as in the first embodiment.

The subsequent processes can be performed utterly in the same manner as in the first embodiment.

As described above, by forming the oxide film 16 between the silicon nitride film 6 which serves as the first oxidization prevention layer and the polysilicon film 7 which is a semiconductor layer, the silicon nitride film 6 is allowed to have a thin thickness, and the etching of the silicon nitride film 6 due to the over-etching of the polysilicon film 7 is suppressed. Furthermore, the total film thickness can be made smaller when phosphorus ions are implanted in forming the N-well at step (d), and etching of the oxide film 11 with a hydrofluoric acid aqueous solution in a subsequent stage can be stabilized.

Figure 3A:
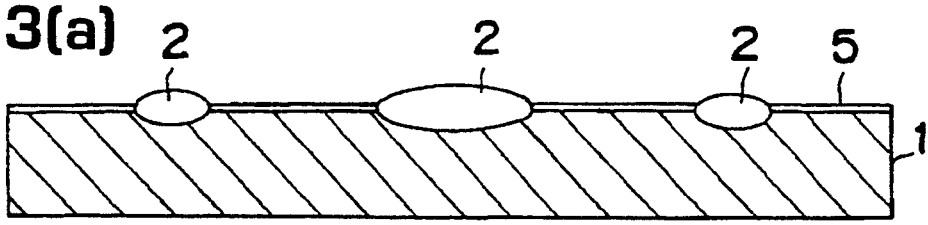
FIGS. 3(a)–3(f) illustrate a semiconductor device production process according to a second embodiment of the present invention, wherein step (d) in FIG. 3(d) is continued on step (e) in FIG. 3(e)
Figure 3B:
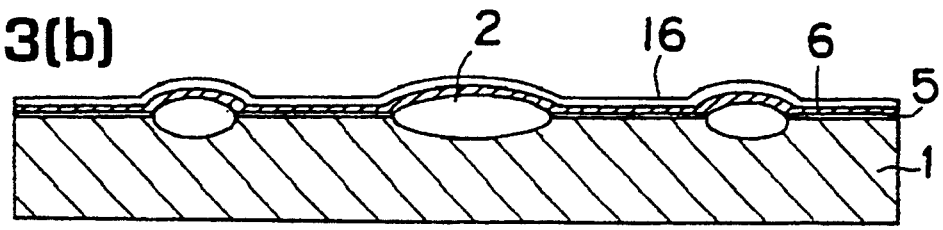
Figure 3C:
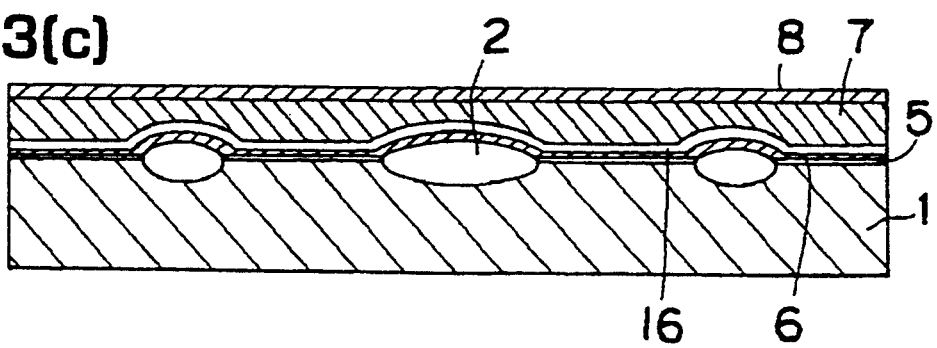
Figure 3D:
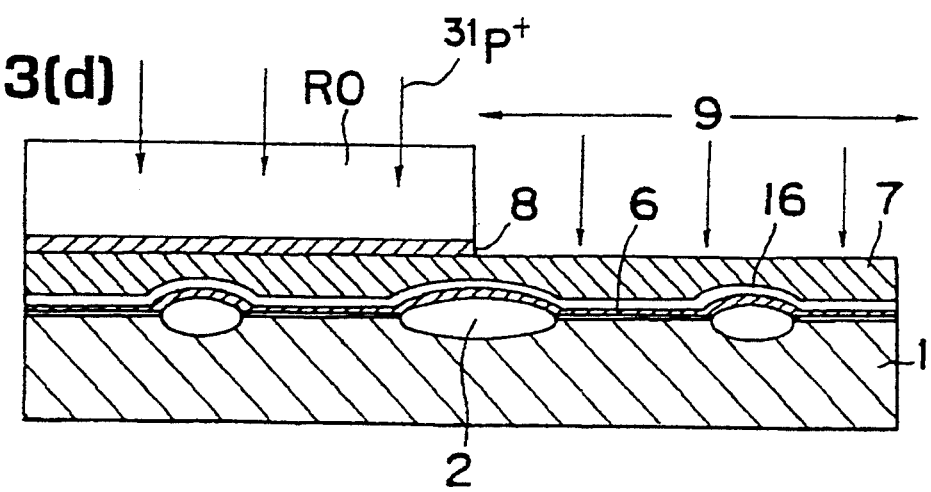
Figure 3E:
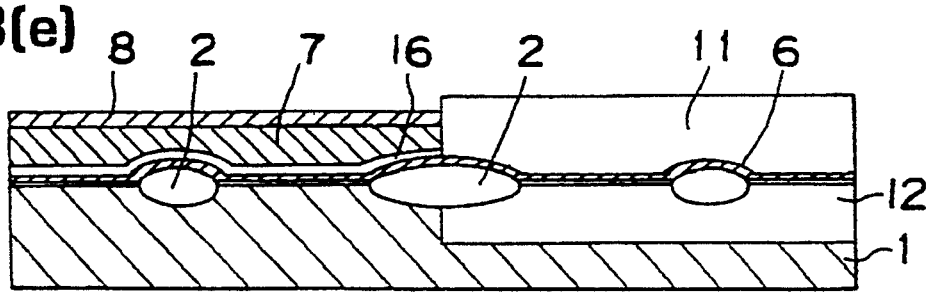
Figure 3F:
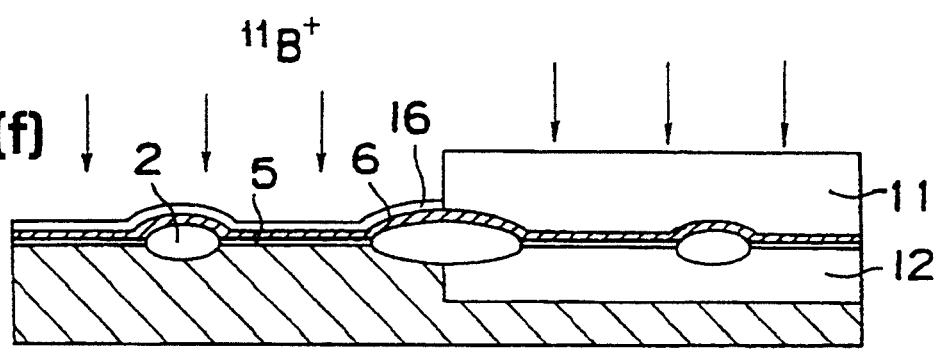
Figure 4:
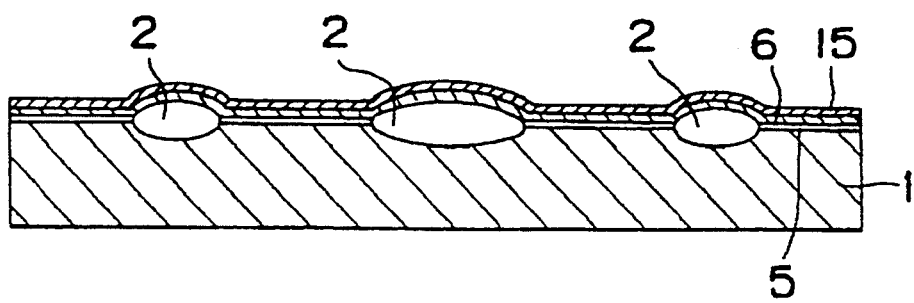
FIG. 4 illustrate a modification of the semiconductor device production process of the first and second embodiments of the present invention.

In the first and second embodiments as described above, after coating the active regions with the oxide film 5 and forming the boron diffusion layer and before forming the first silicon nitride film 6 (steps (a) and (b) in FIGS. 2(a) and 3(b), a polysilicon film 15 having a thickness of 35 nm may be formed by an LP-CVD (Lower Pressure-Chemical Vapor Deposition) method as shown in FIG. 4. In this case, the polysilicon film 15 is removed by a plasma etching method after removal of the first silicon nitride film 6 following ion-plantation of boron for the formation of the P-well.

Figure 5:
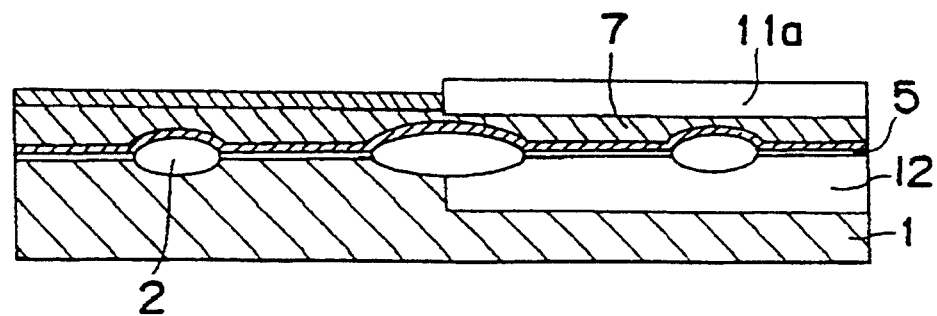
FIG. 5 illustrate another modification of the semiconductor device production process of the first and second example of the present invention.

Furthermore, in the above embodiments, the whole polysilicon film 7 in the N-well formation region is oxidized so that the oxide film 11 having a thickness about twice as great as that of the polysilicon layer 7 is formed after removing the resist pattern R0. Alternatively, only an upper portion of the polysilicon film 7 in the N-well formation region may be oxidized with a lower portion thereof remaining unoxidized so that an oxide film 11a having a thickness of 230 nm is formed as shown in FIG. 5. In this case, after formation of the P-well 13 in the later step, the oxide silicon film 11a, the remaining polysilicon film 7 and the first silicon nitride film 6 are removed in that order.

Furthermore, in each of the aforementioned cases, the N-well may be formed after the completion of the P-well instead of forming the P-well after the completion of the N-well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device producing method comprising the steps of:
   a) forming element isolation regions of an oxide on a surface of a semiconductor substrate, active regions of the surface of said semiconductor substrate other than said element isolation regions being formed with an oxide film;
   b) forming a first oxidization prevention layer, a semiconductor layer, and a second oxidization prevention layer in that order on said semiconductor substrate formed with said element isolation regions and oxide film;
   c) forming a resist pattern on said second oxidization prevention layer, said resist pattern having a hole in a first conductive type channel MOS transistor formation region wherein a first conductive type channel MOS transistor is to be formed;

d) removing a portion of said second oxidization prevention layer that exists in said first conductive type channel MOS transistor formation region of said semiconductor substrate, whereby a portion of said semiconductor layer that exists in said first conductive type channel MOS transistor formation region is exposed;

e) implanting a second conductive type impurity into said semiconductor substrate in said first conductive type channel MOS transistor formation region using said resist pattern as a mask;

f) removing said resist pattern;

g) thermally treating said substrate in the presence of an oxidizer substance to transform at least an upper portion of said exposed portion of said semiconductor layer into an oxidized semiconductor layer and at the same time to diffuse the implanted impurity in the substrate to thereby form a second conductive type well;

h) removing the remaining second oxidization prevention layer and said semiconductor layer located under the remaining second oxidization prevention layer, said remaining second oxidization prevention layer and semiconductor layer being located in a second conductive type channel MOS transistor formation region wherein a second conductive type channel MOS transistor is to be formed;

i) implanting a first conductive type impurity into said second conductive type channel MOS transistor formation region of the semiconductor substrate, using said oxidized semiconductor layer as a mask, to thereby form a first conductive type well; and j) forming the first and second conductive type channel MOS transistors in said second and first conductive type wells, respectively.

2. The method as claimed in claim 1, wherein an oxide layer is formed between the first oxidization prevention layer and the semiconductor layer.

3. The method as claimed in claim 1, wherein said semiconductor substrate is a P-type silicon substrate and a P-type buried layer is preliminarily formed in the substrate.

4. The method as claimed in claim 1, wherein said semiconductor substrate is an N-type silicon substrate and an N-type buried layer is preliminarily formed in the substrate.

5. The method as claimed in claim 1, wherein each element isolation region has a thickness ranging from 200 to 500 nm and said oxide film in said active regions has a thickness ranging from 10 to 50 nm.

6. The method as claimed in claim 1, wherein said first oxidization prevention layer is formed of a material selected from the group consisting of silicon nitride or tantalum pentoxide and has a thickness ranging from 10 to 60 nm.

7. The method as claimed in claim 1, wherein a further semiconductor film of a thickness ranging from 10 to 80 nm is formed under said first oxidization prevention layer.

8. The method as claimed in claim 1, wherein said semiconductor layer on said first oxidization prevention layer is formed of polycrystalline silicon in thickness ranging from 200 to 400 nm.

9. The method as claimed in claim 1, wherein said semiconductor layer on said first oxidization prevention layer is formed of amorphous silicon in thickness ranging from 200 to 400 nm.

10. The method as claimed in claim 1, wherein a further oxide film of a thickness ranging from 5 to 30 nm is formed prior to the formation of said semiconductor layer at step (b).

11. The method as claimed in claim 1, wherein said second oxidization prevention layer is formed of a material selected from the group consisting of silicon nitride or tantalum pentoxide and has a thickness ranging from 50 to 250 nm.

12. The method as claimed in claim 1, wherein said resist pattern formed at step (c) has a thickness ranging from 0.7 to 4.0 $\mu$m.

13. The method as claimed in claim 1, wherein at step (e) said second conductive type impurity of $1 \times 10^{12}$ to $1 \times 10^{14}$ cm$^{-2}$ is implanted at an energy of 100–5000 keV.

14. The method as claimed in claim 1, wherein said first and second conductive type channel MOS transistors are a P-channel MOS transistor and an N-channel MOS transistor respectively, and said first and second conductive type wells are a P-well and an N-well respectively.

15. The method as claimed in claim 14, wherein said second conductive type impurity implanted at step (e) is selected from the group consisting of phosphorus or arsenic and said first conductive type impurity implanted at step (i) is selected from the group consisting of boron or indium.

16. The method as claimed in claim 1, wherein said first and second conductive type channel MOS transistors are an N-channel MOS transistor and a P-channel MOS transistor respectively, and said first and second conductive type wells are an N-well and a P-well respectively.

17. The method as claimed in claim 1, wherein said oxidized semiconductor layer obtained at step (g) has a thickness ranging from 0.4 to 1.0 $\mu$m.

18. The method as claimed in claim 1, wherein said first conductive type impurity is implanted a plurality of times at different energies ranging from 10 to 1000 keV.

* * * * *